United States Patent [19]
Ishii et al.

[11] Patent Number: 5,393,998
[45] Date of Patent: Feb. 28, 1995

[54] SEMICONDUCTOR MEMORY DEVICE CONTAINING JUNCTION FIELD EFFECT TRANSISTOR

[75] Inventors: Tatsuya Ishii; Tatsuo Shinohara, both of Hyogo, Japan

[73] Assignee: Mitsubishi Denki Kabushiki Kaisha, Tokyo, Japan

[21] Appl. No.: 65,334

[22] Filed: May 21, 1993

[30] Foreign Application Priority Data

Jul. 17, 1992 [JP] Japan ................................. 4-190898

[51] Int. Cl.⁶ ................... H01L 29/80; H01L 31/112; H01L 27/108; G11C 11/24
[52] U.S. Cl. .................... 257/256; 257/272; 257/296; 257/306; 365/149
[58] Field of Search ............... 257/296, 256, 260, 261, 257/272, 274, 279, 286, 306; 365/149

[56] References Cited

U.S. PATENT DOCUMENTS 3,378,737  4/1968  Welty ................................. 257/256
4,423,490  12/1983  Roesner ............................. 365/149

FOREIGN PATENT DOCUMENTS 54-150091  11/1979  Japan ................................. 257/256

OTHER PUBLICATIONS

"A Capacitor–Over–Bit–Line (COB) Cell with a Hemispherical–Grain Storage Node for 64Mb DRAMS", by M. Sakao et al, IEEE IEDM Technical Digest, pp. 655–658, 1990.

Primary Examiner—Steven Ho Yin Loke
Attorney, Agent, or Firm—Lowe, Price, LeBlanc & Becker

[57] ABSTRACT

The miniaturization of junction field effect transistors constituting memory cells and higher integration of a dynamic semiconductor memory device are attained. Word lines composed of a p-type impurity diffusion layer are formed on an n-type silicon substrate. An n-type impurity diffusion layer is formed within the p-type impurity diffusion layer. The n-type impurity diffusion layer constitutes two source-drain regions and a channel region, and the p-type impurity diffusion layer constitutes a gate region in each junction field effect transistor. The diffusion layer depth of the channel region is less than that of the source-drain regions. Bit lines are connected to one source-drain region, and storage nodes are connected to the other source-drain region. Each capacitor is made of a storage node, a dielectric film and a cell plate electrode.

8 Claims, 15 Drawing Sheets

SEMICONDUCTOR MEMORY DEVICE CONTAINING JUNCTION FIELD EFFECT TRANSISTOR

BACKGROUND OF THE INVENTION

1. Field of the Invention

The present invention relates to junction field effect transistors, a semiconductor memory device containing the transistor and methods for manufacturing the transistor and the memory device. More particularly, the invention relates to junction field effect transistor structures conducive to further miniaturization, to semiconductor memory structures (such as dynamic random access memory structures) suitable for higher memory cell integration, and to methods for manufacturing the transistor and the memory device.

2. Description of the Prior Art

Recent years have seen a rapid growth in the demand for semiconductor memory devices spurred by the widespread use of data processing devices such as computers that use the memory devices. Functionally, the memory devices are required to deliver two things: greater storage capacity and higher speed of operation. Against this background, technologies of semiconductor memory devices are being developed for their greater integration, higher responsiveness and higher reliability.

Of today's semiconductor memory devices, the dynamic random access memory (DRAM) is capable of receiving and outputting data in a random manner. The DRAM is generally made of memory cell arrays and peripheral circuits. The memory cell arrays constitute a memory area for accumulating large quantities of input data. The periphery circuits designate memory cells that are unit memory circuits and control the output and input of data to and from the outside.

FIG. 33 is a block diagram of a typical prior art DRAM structure. In FIG. 33, the DRAM 50 comprises a memory cell array 51, a row and column address buffer 52, a row decoder 53, a column decoder 54, a sense refresh amplifier 55, a data-in buffer 56, a data-out buffer 57 and a clock generator 58. The memory cell array 51 accumulates data to be stored. The row and column address buffer 52 receives from the outside an address signal A0-A9 for selecting a memory cell that constitutes a unit memory circuit. The row decoder 53 designates a memory cell by decoding a row address signal. The column decoder 54 designates a memory cell by decoding a column address signal. The sense refresh amplifier 55 reads the signal from the designated memory cell by amplifying it. The data-in buffer 56 receives data signals from the outside, and the data-buffer 57 outputs stored data to the outside. The clock generator 58 generates and sends a clock signal to the relevant circuit components, the signal acting as their basic control signal.

The memory cell array 51, occupying a large area of the semiconductor chip, has a plurality of memory cells arranged in matrix fashion for storing data units. FIG. 34 is an equivalent circuit diagram of a prior art DRAM with four-bit memory cells constituting the memory cell array 51. In FIG. 34, the memory cell array 51 contains a plurality of word lines WL extended parallelly in the row direction and a pair of bit lines BLa and BLb arranged parallelly in the column direction. Near the points of intersection between the word lines WL and the bit lines BLa and BLb are memory cells M. Each memory cell M shown is made of a capacitor C for accumulating a data charge and a metal insulator semiconductor (MIS). That is, each memory cell is a one-transistor, one-capacitor memory cell. Because of their simple structure, memory cells of the above type are conducive to higher degrees of memory cell array integration and are thus used extensively in large-capacity DRAM's. FIG. 34 shows a loop bit line setup in which the two bit lines BLa and BLb are arranged in parallel with the sense amplifier.

The prior art DRAM works illustratively as follows: in FIG. 33, data are stored in the memory cell array 51 of N (n×m) bits. The memory cell address data by which to write or read data to or from the memory are held in the row and column address buffer 52. The row decoder 53 selects one of n word lines to connect electrically m-bit memory cells via bit lines to the sense refresh amplifier 55. The column decoder 54 selects one of m bit line pairs to connect one sense refresh amplifier 55 with the data-in buffer 56 or data-out buffer 57. In this manner, each desired memory cell is selected from the N-bit memory cell array 51 based on the address signal.

Referring to FIG. 34, the gate electrode of an MIS transistor Tr is connected to the word line WL. One of two source/drain electrodes is connected to one of two electrodes of a capacitor C; the other source/drain electrode is connected to the bit line BLa or BLb. In a data write operation, a desired word line WL is selected so that a predetermined voltage will be applied to the word line WL of which the address is designated. This causes the MIS transistor Tr to conduct and allows the charge of the bit line BLa or BLb to flow into the capacitor C where the charge is stored. In a data read operation, the predetermined voltage is applied to the selected word line WL. This causes the MIS transistor Tr to conduct and allows the charge in the capacitor C to be taken out via the bit line BLa or BLb.

Technologies of semiconductor memory devices are progressing rapidly toward higher integration. The trend is accompanied by a rush toward greater miniaturization of semiconductor device patterns that are formed in the memory devices. The standing demand for quicker, smaller semiconductor memory devices of larger capacities dictates that the memory devices have finer semiconductor device patterns inside. This applies in particular to the DRAM cells outlined above. It then becomes necessary not only to reduce the sizes of elements such as transistors and capacitor but also to reduce in size the memory cells made of such elements. The reductions contribute to decreasing the memory cell area which should occupy as little space as possible on the semiconductor substrate. Today, development of diverse memory cell structures is in progress in search of ever-smaller memory cell areas.

A typical memory cell structure of the 64-megabit DRAM is disclosed by M. Sakao et al. in IEEE IEDM Technical Digest, pp. 655–658, 1990, "A Capacitor-Over-Bit-Line (COB) Cell with a Hemispherical-Grain Storage Node for 64 Mb DRAMs." FIG. 35 is a cross-sectional view of the prior art DRAM cell structure disclosed in the above reference. In FIG. 35, two memory cells are formed on the main surface of a p-type silicon substrate 1. The memory cells are surrounded by isolation oxide films 10 and share a bit line contact 8. On the right- and left-hand sides of the bit line contact 8 are gate electrodes 5c of an n-channel MIS transistor. The n-channel MIS transistor comprises the gate electrodes 5c formed on the p-type silicon substrate 1 with a thin gate isolation film 17 interposed between substrate and electrode, and n-type source/drain impurity diffusion layers 18 disposed on the right- and left-hand sides of the gate electrodes 5c. One n-type source/drain impurity diffusion layer 18 is connected to bit lines 6 and the other n-type source/drain impurity diffusion layer 18 to storage nodes 7 that constitute capacitors. The gate electrodes 5c of the MIS transistor double as first word lines connected to the transistor. Because the memory device adopts the loop bit line structure, the isolation oxide films 10 are topped with the first word lines 5c connected to the gate electrodes of adjacent memory cells. The bit lines 6, connected to the bit line contact 8, are formed above the first word lines 5c. Above the bit lines 6 are second word lines 5b which, formed of an aluminum wiring layer, are connected in parallel with the first word lines 5c.

To raise the degree of integration from the 64-megabit DRAM of FIG. 35 to DRAM's of 256 megabits and further on to those of one gigabits requires reducing progressively the area of each memory cell on the semiconductor substrate. This is where difficulties are experienced. In particular, attempts to reduce in size the MIS transistors constituting memory cells often involve having hot carrier generated by impact ionization at the pinched-off portions of the drain region edges. Hot carrier generation leads to long-term degradation of transistor characteristics. With reliability thus compromised, the miniaturization of MIS transistor channel lengths in the submicron region turns out to be very difficult.

U.S. Pat. No. 4,423,490 discloses a DRAM using junction field effect transistors, a variation of the same field effect transistor type as the MIS transistor. However, the disclosure does not include transistor structures for enhancing the integration of junction field effect transistors.

SUMMARY OF THE INVENTION

It is an object of the present invention to provide a junction field effect transistor structure for contributing to higher integration of a semiconductor memory device.

It is another object of the invention to provide a junction field effect transistor structure contributing to DRAM cell miniaturization.

It is a further object of the invention to provide a transistor structure, whereby the transistor making up the memory cell will not degrade in characteristics when reduced in size.

It is an even further object of the invention to provide a junction field effect transistor structure wherein the potential of gate regions is controlled independently of the substrate potential.

It is another object of the invention to provide a dynamic semiconductor memory device of high integration by reducing the spacing between word lines therein.

It is a further object of the invention to provide a method for manufacturing a junction field effect transistor contributing to higher integration of semiconductor memory device as well as to greater DRAM cell miniaturization.

It is an even further object of the invention to provide a method for manufacturing a transistor structure, whereby the transistor making up the memory cell will not degrade in characteristics when reduced in size.

It is another object of the invention to provide a method for manufacturing a dynamic semiconductor memory device wherein the spacing between word lines is readily reduced for higher integration.

In carrying out the invention and according to one aspect thereof, there is provided a junction field effect transistor comprising a semiconductor substrate of a first conductivity type and an impurity region of a second conductivity type. The semiconductor substrate has a main surface. The impurity region is formed on the main surface of the semiconductor substrate. The impurity region includes a channel region, and a first region and a second region. The channel region is interposed between the first and second regions with a predetermined distance. The junction depth of the channel region is less than that of each of the first and second regions. The region of the semiconductor substrate which surrounds the impurity region constitutes a gate region.

According to another aspect of the invention, there is provided a junction field effect transistor comprising a semiconductor substrate, an impurity region of a first conductivity type and an impurity region of a second conductivity type. The impurity region of the first conductivity type is formed on the main surface of the semiconductor substrate. The impurity region of the second conductivity type is formed on the main surface side of the semiconductor substrate so as to contact the impurity region of the first conductivity type. The impurity region of the second conductivity type includes a channel region, and a first and a second region. The channel region is interposed between the first and second regions with a predetermined distance. The junction depth of the channel region relative to the impurity region of the first conductivity type is less than that of each of the first and second regions. The impurity region of the first conductivity type constitutes a gate region.

According to further aspect of the invention, there is provided a method for manufacturing a junction field effect transistor, whereby an impurity region of a second conductivity type is formed on the main surface of a semiconductor substrate of a first conductivity type. In the impurity region of the second conductivity type, a first and a second region are formed at a predetermined distance apart and a third region is interposed between the first and second regions. The impurity region is processed so that a junction depth of the first and second regions becomes greater than that of the third region. This forms the semiconductor substrate of the first conductivity type into a gate region and the third region into a channel region.

In a junction field effect transistor according to the invention, the region surrounding the impurity region with the channel region constitutes a gate region. That is, the gate region is not formed on the main surface of the semiconductor substrate. In a dynamic semiconductor memory device, the gate regions of field effect transistors constituting the memory cells are connected with each other and constitute word lines. Because the gate regions are not formed on the main surface of the semiconductor substrate in the junction field effect transistor, the word lines formed of gate regions occupy the main surface of the semiconductor substrate when applied in a dynamic semiconductor memory device. This structure contributes to further miniaturization of the memory cells of a dynamic semiconductor memory and hence to higher memory cell integration thereof.

Conventional MIS transistors are liable to suffer from the so-called hot carrier phenomenon. It involves hot electrons generated by impact ionization in the pinched-off region (high field region) at the edge of the drain region. The hot electrons are trapped in the insulation film of the insulation gates, causing long-term deterioration of transistor characteristics. With the junction field effect transistor according to the invention, the hot carrier phenomenon is also observed; hot electrons are generated when the transistor is turned on and when it is turned off. But there is a difference. Unlike conventional MIS transistors, the absence of insulation films in the gate region of the junction field effect transistor eliminates the possibility of the hot electrons getting trapped and causing long-term deterioration of transistor characteristics. As a result, the junction field effect transistor according to the invention permits the reduction of the distance between source and drain regions, i.e., channel length, to the limits available with existing processing technology. In other words, minimizing the channel length does not trigger the hot carrier phenomenon causing transistor characteristic degradation. This makes it possible to reduce the size of the junction field effect transistor to the limit attainable with existing processing technology. When used as the memory cells of a semiconductor memory, the junction field effect transistors according to the invention make the memory cells smaller and thereby boost the degree of semiconductor memory integration.

According to another aspect of the invention, there is provided a junction field effect transistor comprising a semiconductor substrate and an impurity region of a first conduction type constituting a gate region, the impurity region being formed independently of the semiconductor substrate. This structure allows the potential of the gate region to be controlled independently of the potential of the semiconductor substrate. Preferably, the junction field effect transistor of this structure includes a first and a second region on which is formed a polycrystal silicon layer containing impurities of a second conductivity type, the layer being treated by heat. The heat treatment diffuses the impurities of the second conductivity type from the polycrystal silicon layer into the first and second regions. This makes the junction depth of the first and second regions greater than that of a third region.

According to yet another aspect of the invention, there is provided a semiconductor memory device comprising junction field effect transistors, capacitors, a semiconductor substrate, an impurity region of a first conductivity type and an impurity region of a second conductivity type. The impurity region of the first conductivity type is formed on the main surface of the semiconductor substrate. The impurity region of the second conductivity type is formed on the main surface side of the semiconductor substrate so as to contact the impurity region of the first conductivity type. Each of the junction field effect transistors includes the impurity region of the first conductivity type and that of the second conductivity type. The impurity region of the first conductivity type constitutes a gate region. The impurity region of the second conductivity type includes a channel region, and a first and a second region. The channel region is interposed between the first and the second regions with a predetermined distance. The junction depth of the channel region relative to the impurity region of the first conduction type is less than the junction depth of each of the first and second regions. Each capacitor contains a first electrode that contacts the first region, a dielectric film formed on the first electrode, and a second electrode formed on the dielectric film.

According to a further aspect of the invention, there is provided a dynamic semiconductor memory device comprising junction type field effect transistors, capacitors, a semiconductor substrate, a plurality of word lines, a plurality of bit lines and a plurality of memory cells. The plurality of word lines, formed on the main surface of the semiconductor substrate, are electrically isolated from one another and constitute an impurity region of a first conductivity type extending in a first direction. The plurality of bit lines, formed on top of the word lines, extend in a second direction perpendicular to the first direction. The plurality of memory cells are located at points of intersection between word and bit lines. Each memory cell contains a junction field effect transistor and a capacitor. Each junction field effect transistor includes a gate region and an impurity region of a second conductivity type. The gate region is made of that impurity region of the first conduction type which is connected to the word lines. The impurity region of the second conductivity type is formed so as to contact the gate region on the main surface of the semiconductor substrate. The impurity region of the second conductivity type includes a channel region, and a first and a second region. The channel region is interposed between the first and the second regions with a predetermined distance. Each bit line is formed so as to contact the second region. The junction depth of the channel region relative to the gate region is less than the junction depth of each of the first and second regions. Each capacitor contains a first electrode that contacts the first region, a dielectric film formed on the first electrode, and a second electrode formed on the dielectric film.

According to a still further aspect of the invention, there is provided a method for manufacturing a semiconductor memory device, whereby an impurity region of a first conductivity type is formed in the main surface of a semiconductor substrate. On the main surface side of the semiconductor substrate, an impurity region of a second conductivity type is formed so as to contact the impurity region of the first conductivity type. On the impurity region of the second conductivity type, a first and a second region are formed at a predetermined distance apart and flank a third region. The impurity region of the second conductivity type is processed in such a manner that the junction depth of the first and second regions becomes greater than that of the third region. This forms the semiconductor substrate of the first conductivity type into gate regions and the third region into channel regions of junction field effect transistors. In each junction field effect transistor, a first electrode is formed so as to contact the first region. On the first electrode is a dielectric film which in turn is topped with a second electrode.

In a semiconductor memory device according to the invention, the gate region of a junction field effect transistor constituting each memory cell is formed of the impurity region of the first conductivity type. This impurity region is formed on the main surface of the semiconductor substrate. Thus, the main surface of the semiconductor substrate does not have any word lines that would connect the gate regions of the memory cells; the word lines may be formed inside the semiconductor substrate. The impurity region of the second conductivity type, to be connected to the bit lines, is formed so as to contact the gate region on the main surface side of the semiconductor substrate. That is, the impurity region of the second conductivity type exists closer to the main surface side of the semiconductor substrate than to the word lines made of that impurity region of the first conductivity type which is connected to the gate region. The structure allows the contacts between the bit lines and the impurity region of the second conductivity type to be located on top of the word lines. In other words, unlike conventional dynamic semiconductor memory devices, there is no need to furnish bit line contact regions between the word lines. With the spacing between the word lines thus reduced, the memory cells are made smaller and the semiconductor memory device made thereof is enhanced in terms of integration.

Another preferred dynamic semiconductor memory device according to the invention comprises a semiconductor substrate and an insulation oxide film of a first film thickness, wherein a plurality of word lines are electrically isolated from one another. The isolation oxide film contains portions of a second film thickness that is less than the first film thickness, the portions being adjacent to impurity regions of the second conductivity type. The portions of the second film thickness on the semiconductor substrate side are shallower in depth than the impurity regions of the first conductivity type. The first electrodes extend over the bit lines and the isolation oxide film, with an insulation film interposed between the first electrodes and the bit lines.

These and other objects, features and advantages of the invention will become more apparent from a reading of the following description and appended drawings.

DESCRIPTION OF THE PREFERRED EMBODIMENTS

Figure 1:
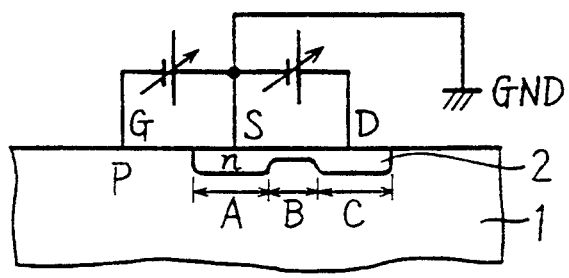
FIG. 1 is a conceptual cross-sectional view of a junction field effect transistor in a first preferred embodiment according to the present invention.

Referring to FIG. 1, there is formed an n-type impurity diffusion layer 2 on the main surface of a p-type silicon substrate 1. The n-type impurity diffusion layer 2 is divided into three regions A, B and C. As illustrated in FIG. 1, the diffusion layer in the region B at the center is shallower than the diffusion layer in the regions A and C. In this junction field effect transistor structure in the first embodiment according to the invention, source and drain regions are made of the n-type impurity diffusion layer 2 in the regions A and C, and gate region is formed by the p-type silicon substrate 1. The n-type impurity diffusion layer 2 in the region B constitutes a channel region. Although the junction field effect transistor of FIG. 1 is an n-channel type, it may be alternatively a p-channel type, wherein the p-type silicon substrate 1 is replaced by an n-type silicon substrate; and the n-type impurity diffusion layer, by a p-type impurity diffusion layer.

Figure 36:
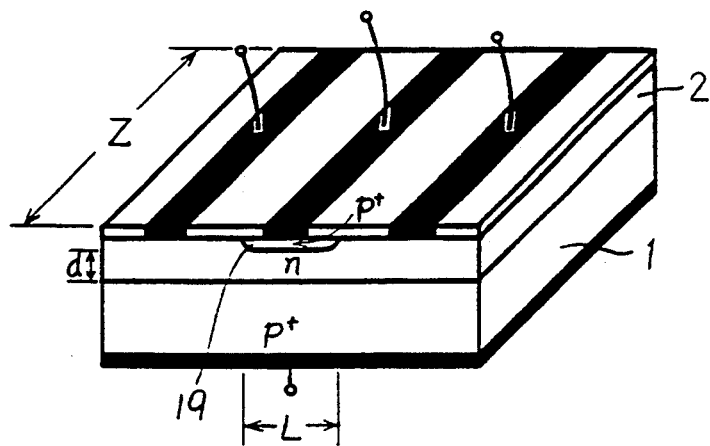
FIG. 36 is a perspective view of a prior art junction field effect transistor structure.

Before depicting how the junction field effect transistor of FIG. 1 works, a description of the workings of the typical prior art junction field effect transistor is in order. Referring to FIG. 36, there is formed an n-type impurity diffusion layer 2 having a uniform diffusion layer depth on the main surface of a p-type silicon substrate 1. Near the center of the n-type impurity diffusion layer 2 is a gate diffusion layer 19 whose depth is less than that of the n-type impurity diffusion layer 2. Source and drain regions are made of the edges on both sides of the n-type impurity diffusion layer 2, and gate electrodes are constituted of the gate diffusion layer 19.

Figure 37A:
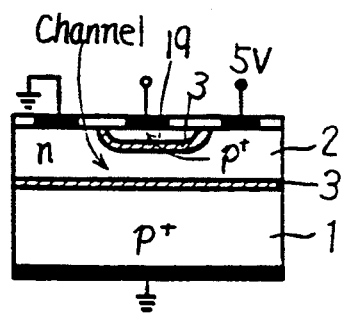
FIGS. 37A and 37F are cross-sectional views of assistance in explaining how the prior art junction field effect transistor works.
Figure 37B:
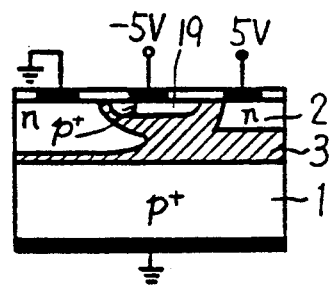

How the prior art junction field effect transistor works will now be described with reference to FIGS. 37A and 37B. FIG. 37A shows the state in which the transistor is turned on. The drain voltage $V_{DS}$ is 5 V and the gate voltage $V_G$ is 0 V. In this setup, a depletion layer 3 between the p-type silicon substrate 1 and the n-type impurity diffusion layer 2 is not in contact with another depletion layer 3 between the n-type impurity diffusion layer 2 and the gate diffusion layer 19. Because the n-type impurity diffusion layer 2 between the source and drain regions contains a channel region, currents flow therethrough. FIG. 37B indicates the state in which the transistor is turned off. The drain voltage $V_{DS}$ is 5 V (as in the case of FIG. 37A) and the gate voltage VG is −5 V. In this setup, the depletion layer 3 between p-type silicon substrate 1 and n-type impurity diffusion layer 2 is in contact with the depletion layer 3 between the n-type impurity diffusion layer 2 and the gate diffusion layer 19. Since the channel region between the source and drain regions is blocked, no currents flow therethrough.

The operating principle of the junction field effect transistor according to the present invention is basically the same as that of the prior art junction field effect transistor described above. How the invented transistor works will now be described in more detail with reference to FIGS. 2, 3A and 3B.

Figure 2:
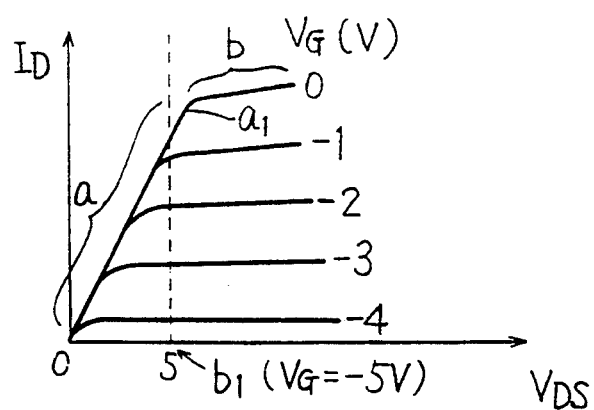
FIG. 2 is a graphic representation of the VDS-ID characteristic of the junction field effect transistor in the first preferred embodiment according to the present invention.

FIG. 2 shows a typical $V_{DS}$-$I_D$ characteristic of the transistor with the gate voltage $V_G$ set to 0 V. A linear region a of FIG. 2 corresponds to the setup of FIG. 3A in which the depletion layer 3 between the p-type silicon substrate 1 and the n-type impurity diffusion layer 2 does not contact the topmost surface of the p-type silicon substrate 1. That is, the channel region exists in the n-type impurity diffusion layer 2. Thus, as the drain voltage $V_{DS}$ is raised, the drain current $I_D$ increases proportionately. Meanwhile, a saturated region b corresponds to the setup of FIG. 3B in which the depletion layer 3 on the drain region side is expanded by a raised drain voltage $V_{DS}$, whereby the depletion layer 3 between the p-type silicon substrate 1 and the n-type impurity depletion layer 2 comes into contact with the topmost surface of the silicon substrate 1. The resulting avalanche in the depletion layer 3 causes the drain current $I_D$ to flow. Raising the drain voltage $V_{DS}$ expands the depletion layer 3 crosswise so that the field strength of the layer 3 is kept substantially constant. Thus, the drain current $I_D$ shows little increase and tends to remain saturated.

Figure 3A:
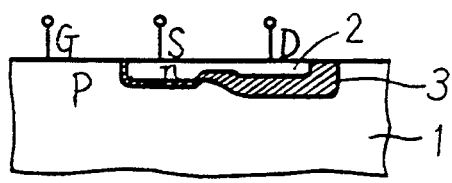
FIGS. 3A and 3B are cross-sectional views of assistance in explaining how the junction field effect transistor in the first preferred embodiment works.
Figure 3B:
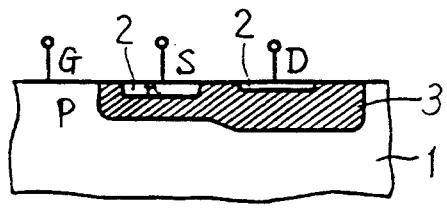

As the gate voltage $V_G$ is lowered from 0 V down, there occurs a growing potential difference between the p-type silicon substrate 1 of gate electrodes and the n-type impurity diffusion layer 2 of drain electrodes. This causes the depletion layer 3 to become more liable to expand. That is, at a low level of the drain voltage $V_{DS}$, the depletion layer 3 comes into contact with the topmost surface of the silicon substrate 1. Thus, as depicted in FIG. 2, the point of inflection of the linear region a and saturated region b shifts to lower levels of the drain voltage $V_{DS}$ as the gate voltage $V_G$ drops.

Where the drain voltage $V_{DS}$ is held constant at 5 V, controlling appropriately the gate voltage $V_G$ produces the on-state of FIG. 3A ($V_G$=0 V; linear region $a_1$) and the off-state of FIG. 3B ($V_G$=−5 V; saturated region $b_1$).

Figure 4:
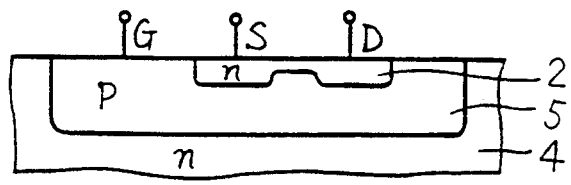
FIG. 4 is a conceptual cross-sectional view of a junction field effect transistor in a second preferred embodiment according to the present invention.

Below is a description of the junction field effect transistor structure in the second embodiment according to the invention. Referring to FIG. 4, an n-type silicon substrate 4 is topped with an island made of a p-type impurity diffusion layer 5. The p-type impurity diffusion layer 5 constitutes gate regions. The structure makes it possible to control the gate electrode potential independently of the substrate potential. The workings of this junction field effect transistor are exactly the same as those of the field effect transistor of FIG. 1.

What follows is a description of the preferred methods for manufacturing junction field effect transistors according to the present invention. First to be described is the first method embodiment of the invention, whereby a deep impurity diffusion layer of source and drain regions is produced through the use of impurity diffusion from a polycrystal silicon layer.

Figure 5:
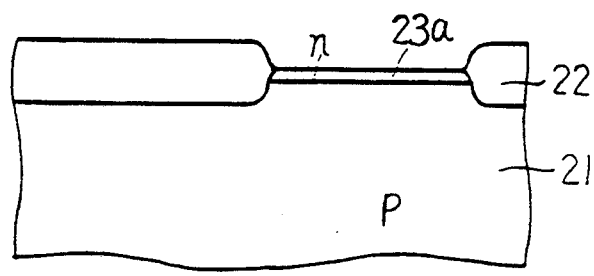
FIGS. 5 through 8 are cross-sectional views of assistance in explaining how the junction field effect transistor of FIG. 1 is manufactured in a first method embodiment.

Referring to FIG. 5, an isolation oxide film 22 made of a thick silicon oxide film is formed by thermal oxidation on a predetermined region of a p-type silicon substrate 21. The isolation oxide film 22 is then used as the mask through which to form a shallow n-type impurity diffusion layer 23a by ion implantation of n-type impurities.

Figure 6:
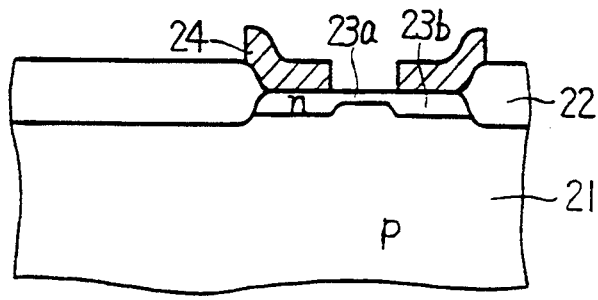

As shown in FIG. 6, a polycrystal silicon layer 24 containing n-type impurities is formed on the source and drain regions only. Subsequent heat treatment causes the n-type impurities of the polycrystal silicon layer 24 to diffuse into the silicon substrate 21. This forms a deep n-type impurity diffusion layer 23b.

Figure 7:
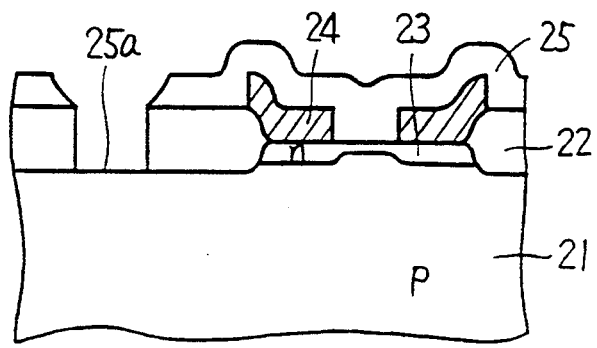

Then as depicted in FIG. 7, a silicon oxide film 25 is formed to act as an interlayer insulation film. Removing the silicon oxide film 25 and isolation oxide film 22 selectively provides contact hole 25a. The contact hole 25a has those side walls which are shown in FIG. 7 because the hole is formed both by isotropic etching and by anisotropic etching.

Figure 8:
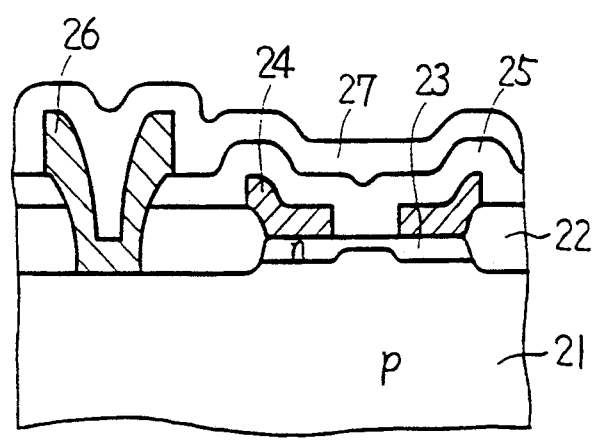

Lastly, as illustrated in FIG. 8, an aluminum wiring layer 26 acting as gate electrode is formed so as to contact the p-type silicon substrate 21 through the contact hole 25a. The aluminum wiring layer 26 is topped with a surface protective film 27 made of a silicon nitride film.

The second method embodiment of the invention for manufacturing junction field effect transistors will now be described. This method involves forming an impurity diffusion layer of source and drain regions by means of ion implantation.

Figure 9:
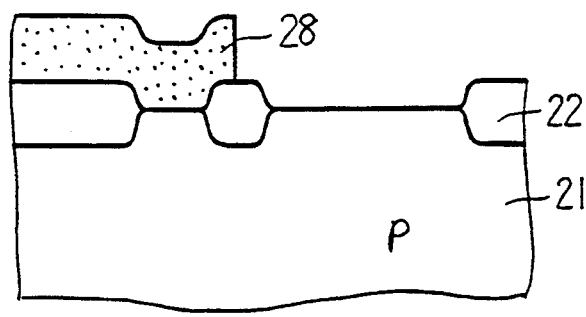
FIGS. 9 through 12 are cross-sectional views of assistance in explaining how the junction field effect transistor of FIG. 1 is manufactured in a second method embodiment.

Referring to FIG. 9, an isolation oxide film 22 made of a thick silicon oxide film is formed by thermal oxidation on a predetermined region of a p-type silicon layer 21. Then, a resist film 28 is provided to cover the region acting as the contact region of gate electrodes.

Figure 10:
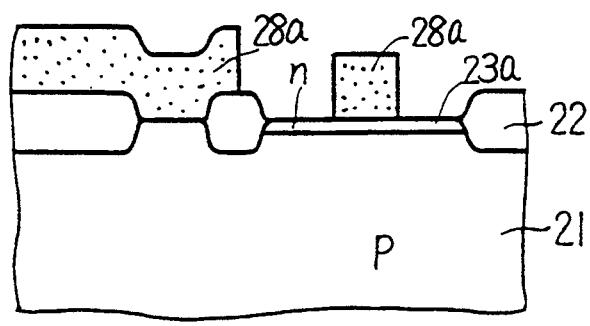

As shown in FIG. 10, ion implantation produces a shallow n-type impurity diffusion layer 23a. With the resist film 28 removed, those regions except the source and drain regions are covered with a resist film 28a.

Figure 11:
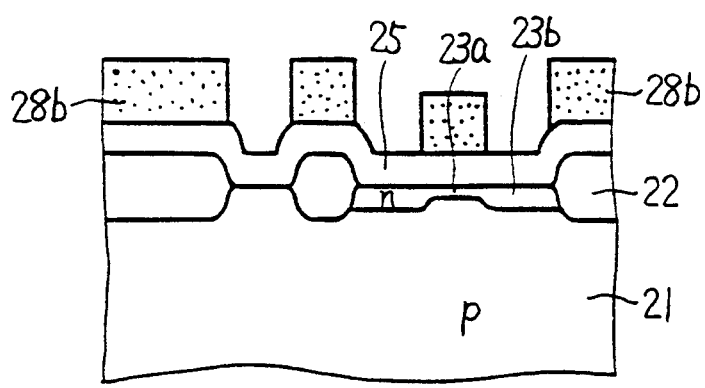

As depicted in FIG. 11, another ion implantation produces a deep n-type impurity diffusion layer 23b. With the resist film 28a removed, a silicon oxide film 25 is formed to act as an interlayer insulation film. Those regions except the source and drain regions and the contact region of gate electrodes are covered with a resist film 28b.

Figure 12:
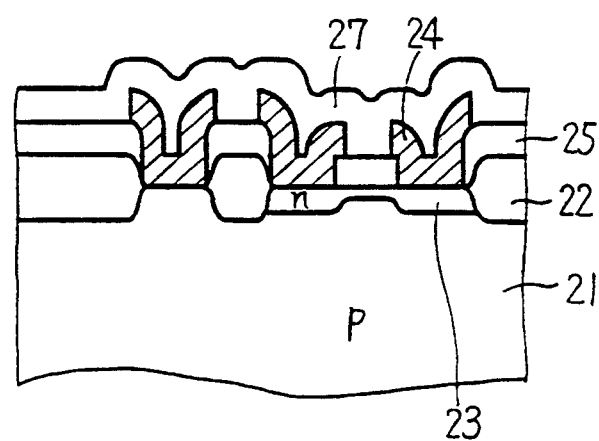

The resist film 28b is used as the mask through which to carry out anisotropic etching for selective removal of the silicon oxide film 25. This produces contact holes. Then, with the resist film 28b removed, a conductive polycrystal silicon layer 24 containing impurities is formed to act as an electrode layer for sources, drains and gates. Lastly, as illustrated in FIG. 12, a surface protective film 27 is made from a silicon nitride film.

The third method embodiment according to the invention for manufacturing junction field effect transistors will now be described. This method involves producing a shallow impurity diffusion layer of the channel region by formation of grooves on a silicon substrate.

Figure 13:
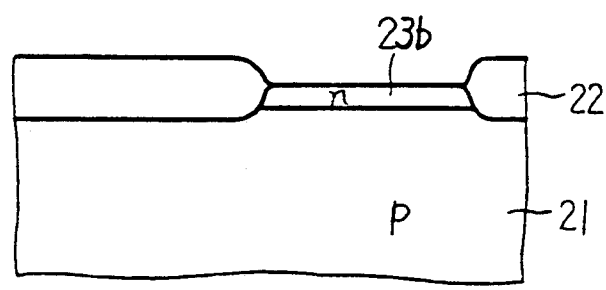
FIGS. 13 through 17 are cross-sectional views of assistance in explaining how the junction field effect transistor of FIG. 1 is manufactured in a third method embodiment.

Referring to FIG. 13, an isolation oxide film 22 made of a thick silicon oxide film is formed by thermal oxidation on a predetermined region of a p-type silicon substrate 21. The isolation oxide film 22 is then used as the mask through which to form a deep n-type impurity diffusion layer 23b by ion implantation.

Figure 14:
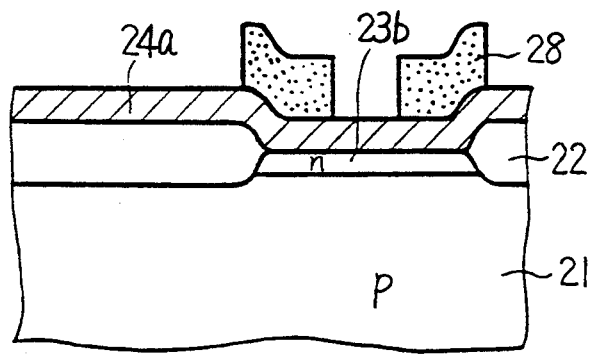

As shown in FIG. 14, a conductive polycrystal silicon layer 24a containing impurities is formed. A resist film 28 is produced over the polycrystal silicon layer 24a for the source and drain regions only.

Figure 15:
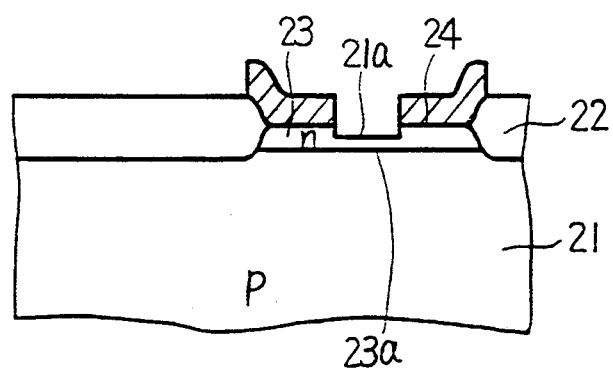

Referring to FIG. 15, the resist film 28 is used as the mask through which to perform anisotropic etching. This produces source and drain electrodes 24 as well as groove 21a on the silicon substrate 21 simultaneously, whereby a shallow n-type impurity diffusion layer 23a is formed. The anisotropic etching step involves the use of a reactive gas such as a mixture of $CF_4$ and $O_2$ for its large etching ratio of silicon (i.e., the silicon substrate 21) with respect to a silicon oxide film (the isolation oxide film 22). Thereafter, the resist film 28 is removed.

Figure 16:
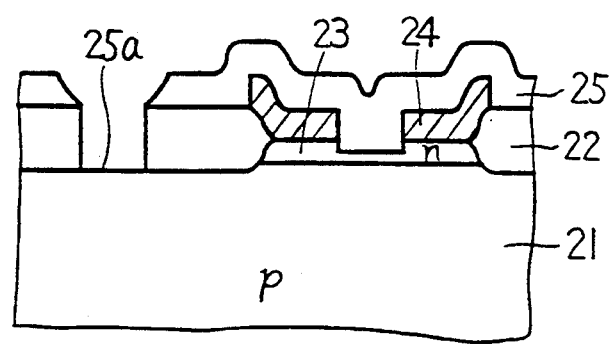

As illustrated in FIG. 16, a silicon oxide film 25 is formed to act as an interlayer insulation film. Selective removal of the silicon oxide film 25 and isolation oxide film 22 forms contact holes 25a that expose the surface of the p-type silicon substrate 21. The contact hole 25a has those side walls which are shown in FIG. 16 because the hole is formed both by isotropic etching and by anisotropic etching.

Figure 17:
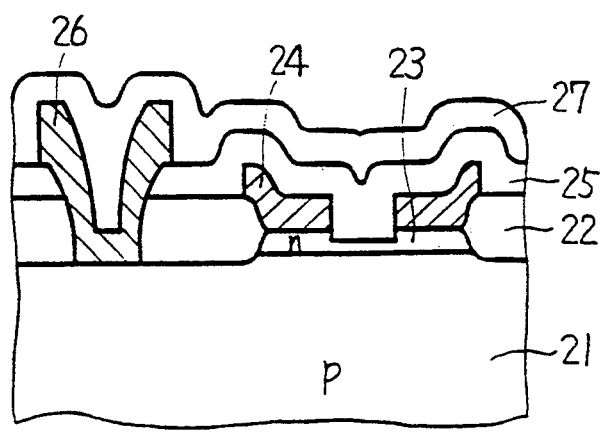

FIG. 17 shows how an aluminum wiring layer 26 is formed to act as gate electrode. Lastly, a surface protective film 27 is made from a silicon nitride film.

The fourth method embodiment according to the present invention for manufacturing junction field effect transistors will now be described. This method involves producing a shallow impurity diffusion layer of the channel region by formation of a thin silicon oxide film on a silicon layer through thermal oxidation.

Figure 18:
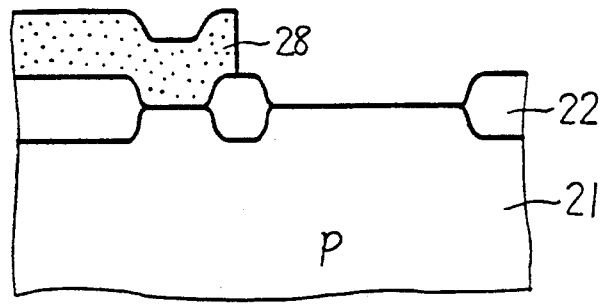
FIGS. 18 through 21 are cross-sectional views of assistance in explaining how the junction field effect transistor of FIG. 1 is manufactured in a fourth method embodiment.

Referring to FIG. 18, an isolation oxide film 22 made of a thick silicon oxide film is formed through thermal oxidation on a predetermined region of a p-type silicon substrate 21. The region that will serve as a contact region of gate electrodes is then covered with a resist film 28.

Figure 19:
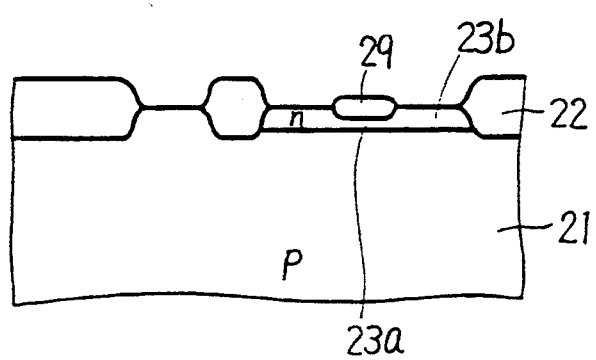

As shown in FIG. 19, ion implantation produces a deep n-type impurity diffusion layer 23b. With the resist film 28 removed, a thin silicon oxide film 29 is formed by thermal oxidation on the channel region. This produces a shallow n-type impurity diffusion layer 23a.

Figure 20:
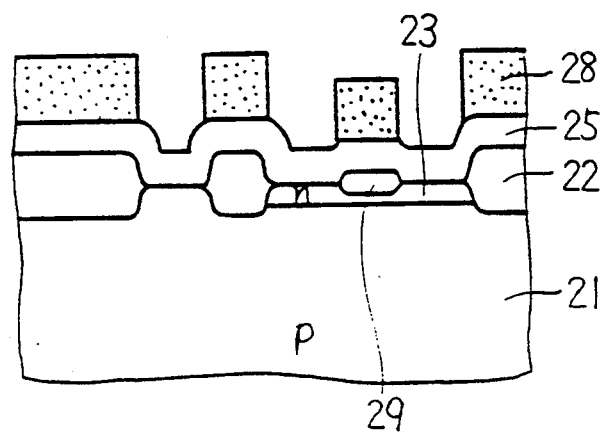

FIG. 20 depicts how a silicon oxide film 25 is formed to serve as an interlayer insulation film. Those regions except the contact region of sources, drains and gates are covered with the resist film 28.

Figure 21:
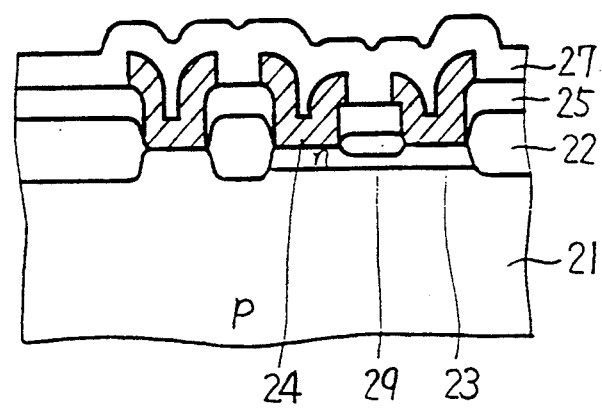

Subsequent anisotropic etching selectively removes the silicon oxide film 25 to form contact holes. Then with the resist film 28 removed, a conductive polycrystal silicon layer 24 containing impurities is formed to constitute source, drain and gate electrodes. Lastly, as shown in FIG. 21, a surface protective film 27 is made from a silicon nitride film.

Below is a description of a typical memory cell structure of a dynamic random access memory (DRAM) that adopts the junction field effect transistor according to the invention.

Figure 22:
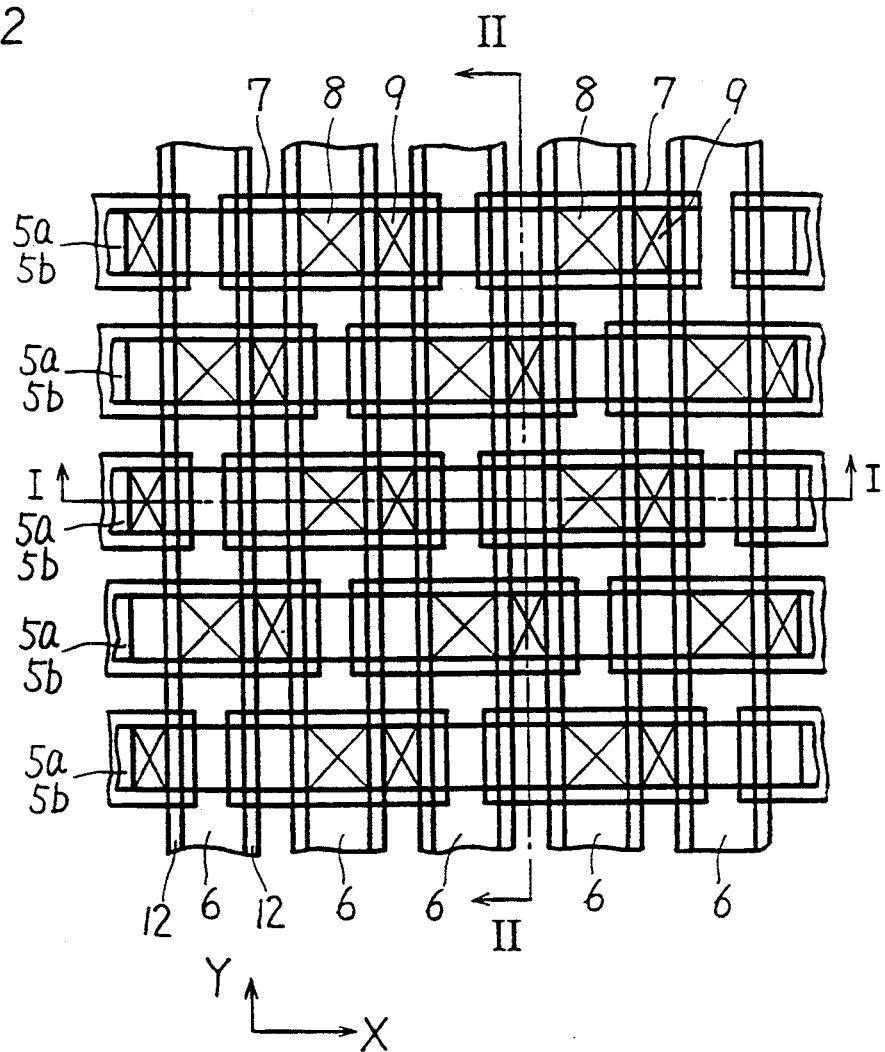
FIG. 22 is a plan view of memory cells constituting a dynamic random access memory (DRAM) in the preferred embodiment according to the present invention.

Referring to FIG. 22, first word lines 5a made of a p-type impurity diffusion layer are extended in parallel in the X direction over an n-type silicon substrate 4. In the Y direction, bit lines 6 made of a first polycrystal silicon layer are extended in parallel.

Figure 23:
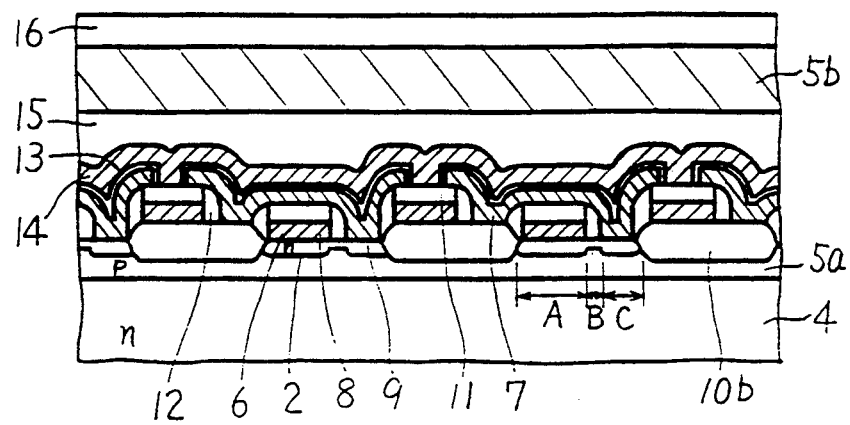
FIG. 23 is a cross-sectional view taken on line I—I in FIG. 22.

In FIG. 23, the p-type impurity diffusion layer of the first word lines 5a contains an n-type impurity diffusion layer 2. The n-type impurity diffusion layer 2 are divided into parallel portions surrounding a second isolation oxide film 10b made of a silicon oxide film. The thickness of the second isolation oxide film 10b on the side of the silicon substrate 4 is less than the diffusion depth of the p-type impurity diffusion layer 5a. As depicted in FIG. 23, the n-type impurity diffusion layer 2 constituting a junction type field effect transistor is composed of three regions A, B and C. The diffusion depth of the region C, which is the channel region, is less than that of the regions A and B which are the source and drain regions. Typically, the diffusion depth of the region B is about 0.1 $\mu$m, and that of the regions A and C, about 0.3 $\mu$m. The channel region B is approximately 0.2 to 0.3 $\mu$m long.

The region A, one of the two source-drain regions, is connected via bit line contacts 8 to the bit lines 6 made of the first polycrystal silicon layer. The region C, the other source-drain region, is connected via storage node contacts 9 to storage nodes 7 made of a second polycrystal silicon layer. On top of the bit lines 6 is a first silicon oxide film 11. The side walls of the bit lines 6 comprise a second silicon oxide film 12. The storage nodes 7 are connected via a dielectric film 13 to cell plate electrodes 14 made of a third polycrystal silicon layer. Each capacitor is composed of a storage node 7, a portion of the dielectric film 13, and a cell plate electrode 14. Because the loop bit line scheme is adopted for this DRAM structure, the second isolation oxide film 10b is topped with the bit lines 6 connected to the bit line contacts 8 of adjacent memory cells.

Figure 24:
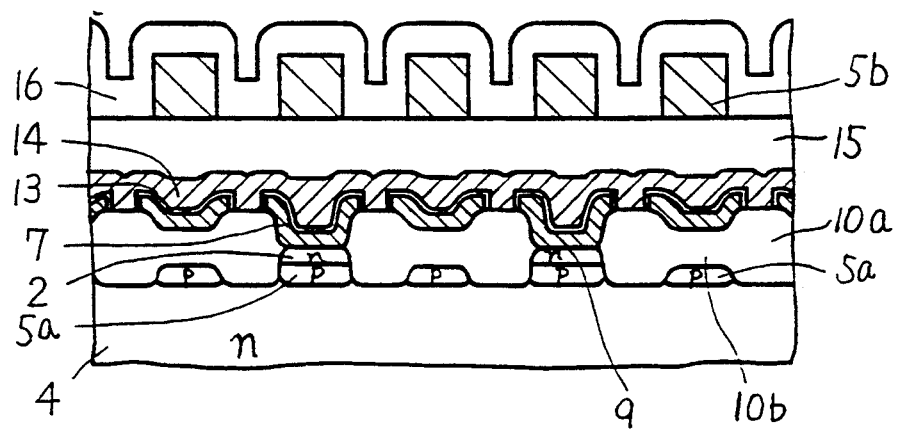
FIG. 24 is a cross-sectional view taken on line II—II in FIG. 22.

Referring to FIG. 24, the first word lines 5a are isolated electrically from the adjacent word lines 5a by means of a first isolation oxide film 10a made of a thick silicon oxide film. The word lines are constituted by the first and second word lines 5a and 5b. The first word lines 5a are composed of a p-type impurity diffusion layer. The second word lines 5b are made of an aluminum wiring layer formed on the cell plate electrodes 14 with an insulation film of a third silicon oxide film 15 interposed therebetween. Although not shown, the first and second word lines 5a and 5b extend in a parallel or in the same direction. The first and second word lines 5a and 5b are connected with each other at a predetermined point. The second word line 5b lowers the wiring resistance of the word line, because one word line is formed of the first and second word line portions 5a and 5b.

Below is a description of how the memory cells of the DRAM according to the present invention work. The workings of the memory cells according to the invention are basically the same as those of the memory cells of prior art MIS transistors. In a data write operation, a predetermined voltage (e.g., 0 V) is first applied to word lines 5a and 5b of a designated address (see FIG. 2). This makes the junction field effect transistor conduct, causing the charge of the bit line 6 to flow into the storage node 7 of the capacitor for storage therein. The word lines 5a and 5b of undesignated addresses remain illustratively subject to $-5$ V. In a data read operation, the predetermined voltage (0 V) is applied to the selected word lines 5a and 5b. This makes the junction field effect transistor conduct, causing the charge of the storage node 7 to be released onto the bit line 6.

Figure 25:
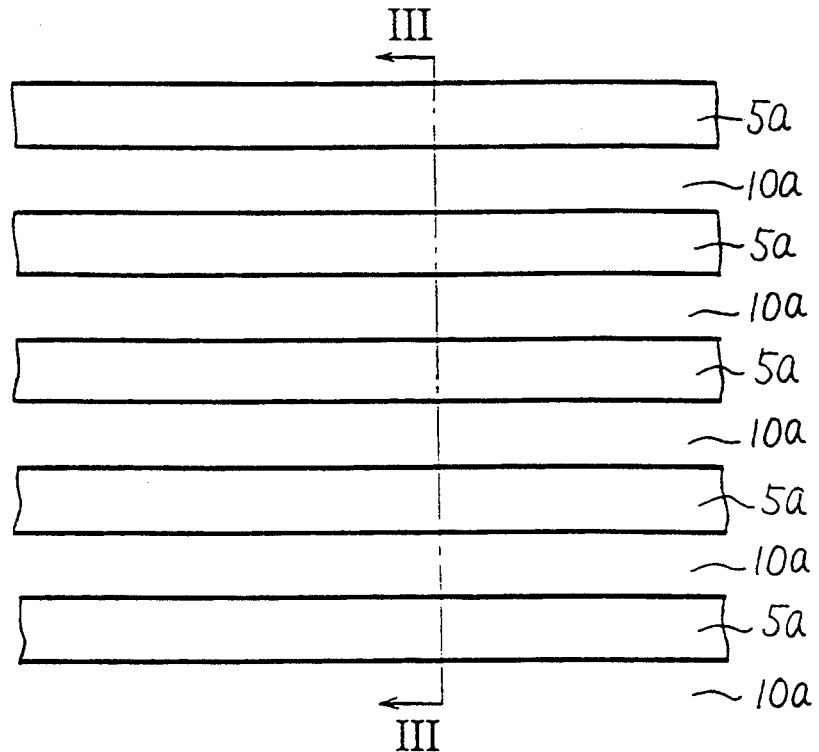
FIGS. 25 through 27 are plan views of assistance in explaining how the memory cells in the DRAM of FIG. 22 are manufactured by different methods according to the present invention.
Figure 28:
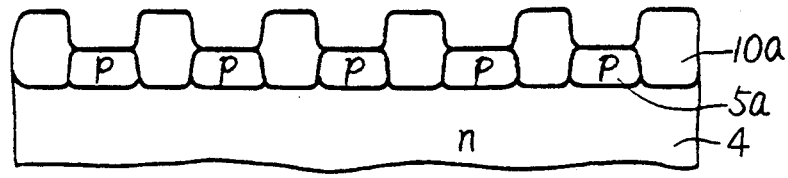
FIG. 28 is a cross-sectional view taken on line III—III in FIG. 25.

Described below is how DRAM memory cells are illustratively manufactured according to the invention. Referring to FIGS. 25 and 28, a first isolation oxide film 10a is formed by thermal oxidation on the main surface of an n-type silicon substrate 4. The first isolation oxide film 10a is used as the mask through which to diffuse p-type impurities. The diffusion of p-type impurities forms first word lines 5a made of a p-type impurity diffusion layer.

Figure 26:
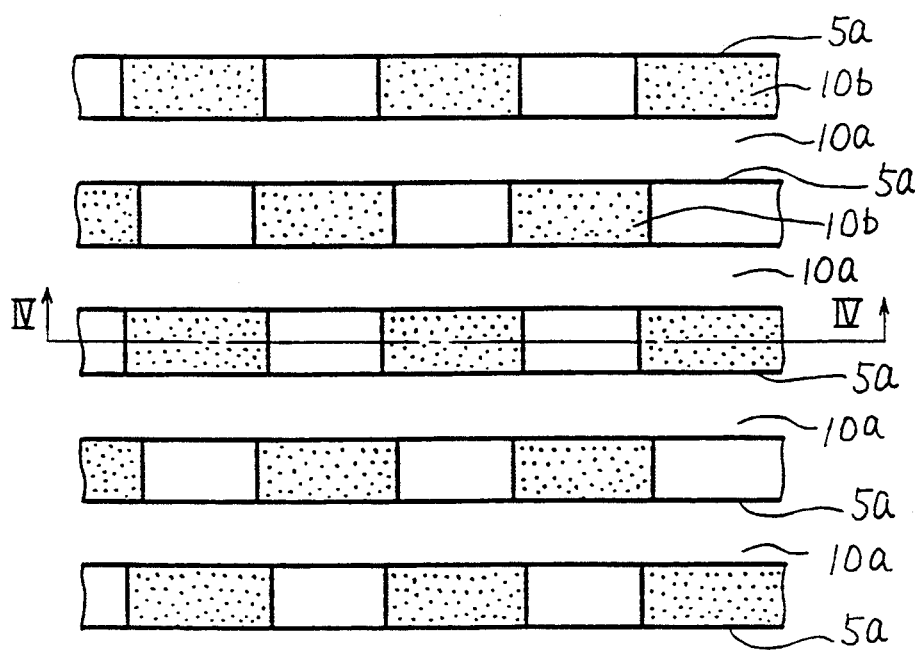
Figure 29:
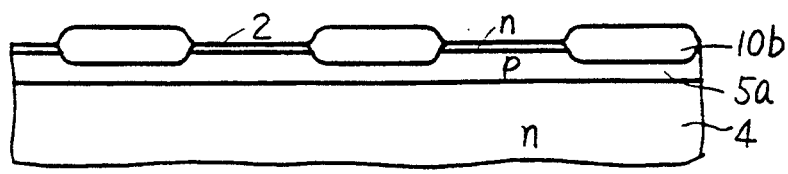
FIG. 29 is a cross-sectional view taken on line IV—IV in FIG. 26.

Referring to FIGS. 26 and 29, a second isolation oxide film 10b is formed by thermal oxidation on the p-type impurity diffusion layer 5a. To form a channel region of the transistor, the first and second isolation oxide films 10a and 10b are used as the mask through which to diffuse impurities. This produces an n-type impurity diffusion layer 2. The thickness of the second isolation oxide film 10b on the side of the silicon substrate 4 is less than the diffusion depth of the p-type impurity diffusion layer 5a constituting the first word lines. The n-type impurity diffusion layer 2 constituting the channel region of the junction field effect transistor is thinner than the second isolation oxide film 10b on the side of the silicon substrate 4.

Figure 27:
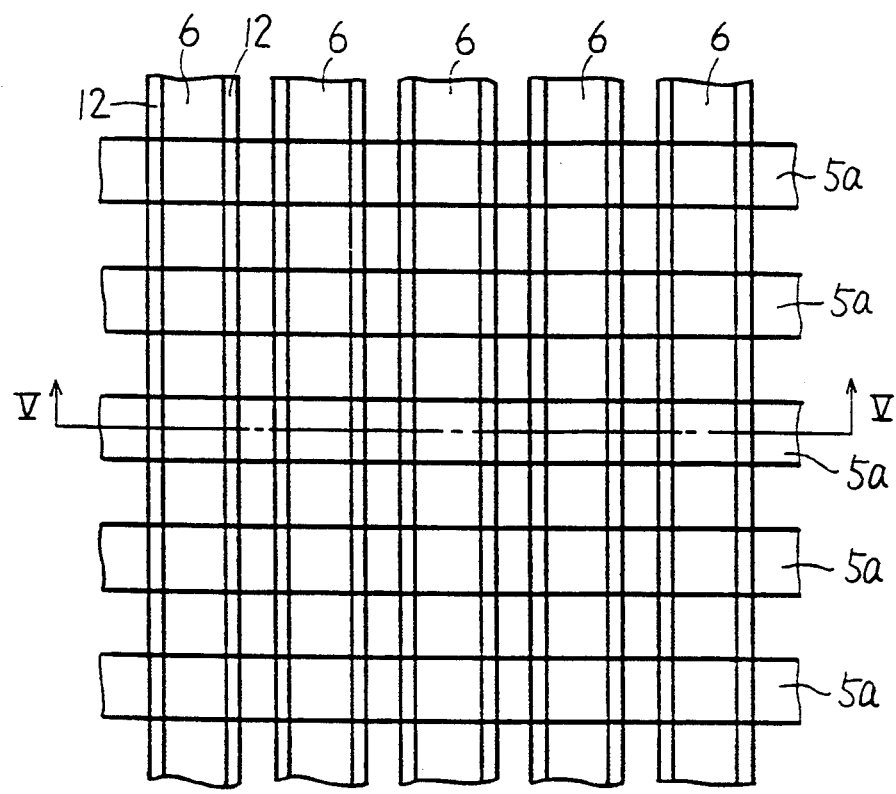
Figure 30:
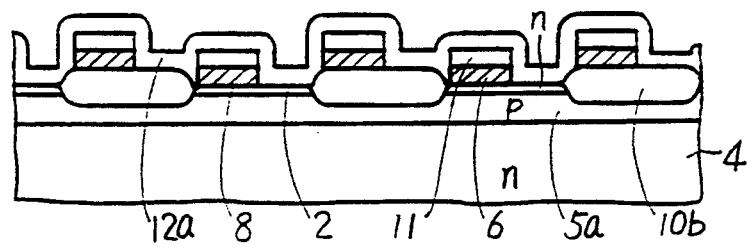
FIG. 30 is a cross-sectional view taken on line V—V in FIG. 27.
Figure 31:
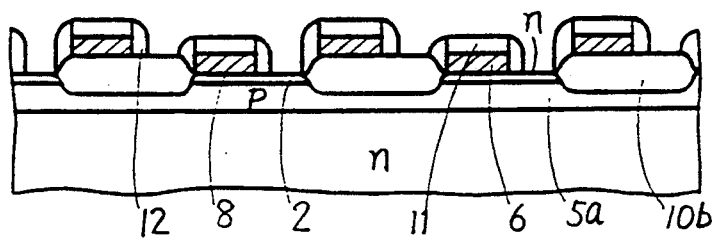
FIG. 31 is another cross-section view taken on line V—V in FIG. 27.
Figure 32:
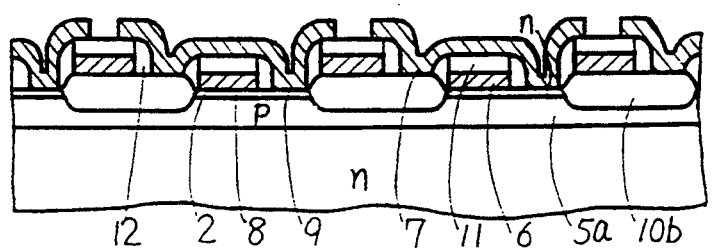
FIG. 32 is a cross-sectional view taken on line I—I in FIG. 22.
Figure 33:
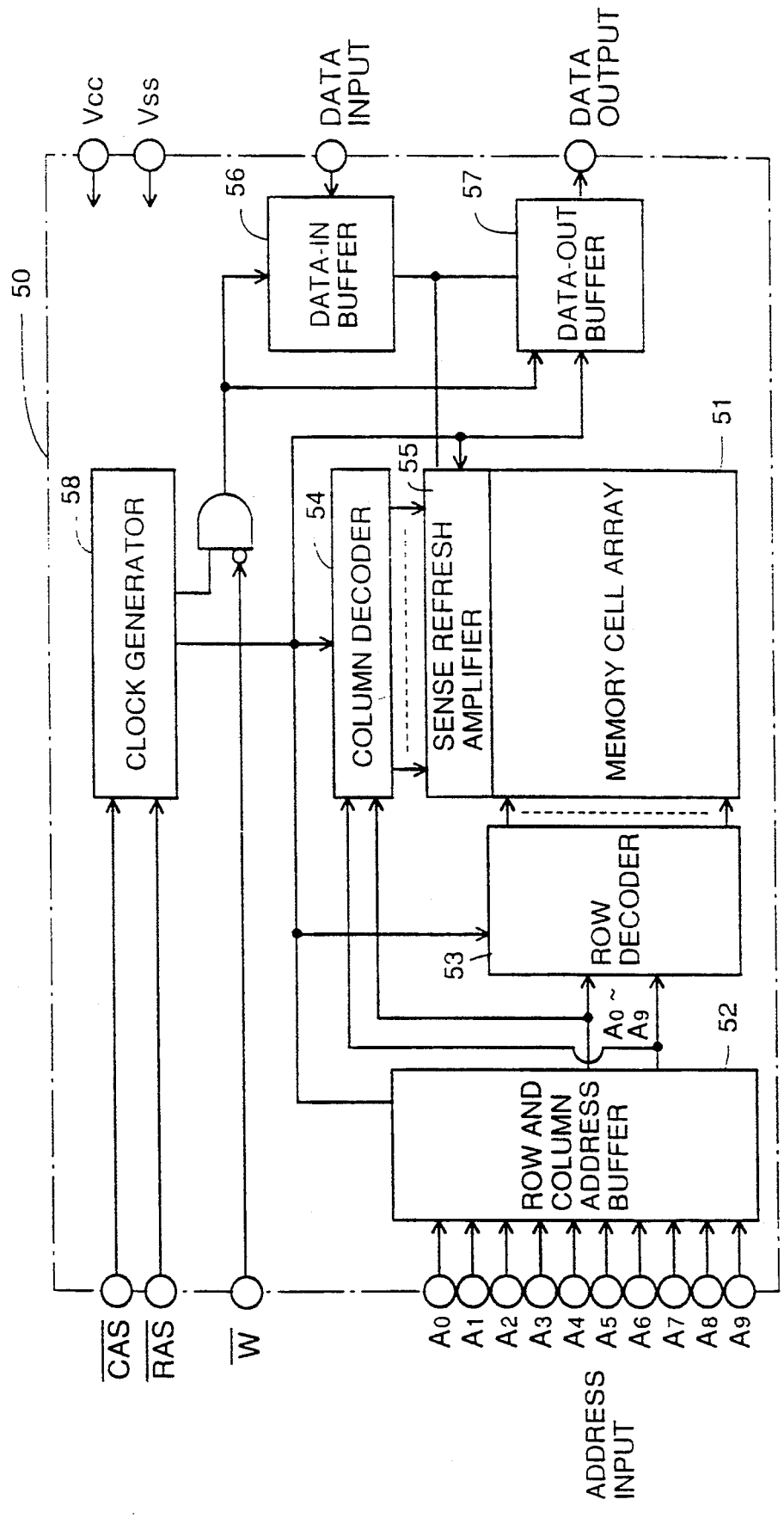
FIG. 33 is a block diagram of a typical prior art DRAM.
Figure 34:
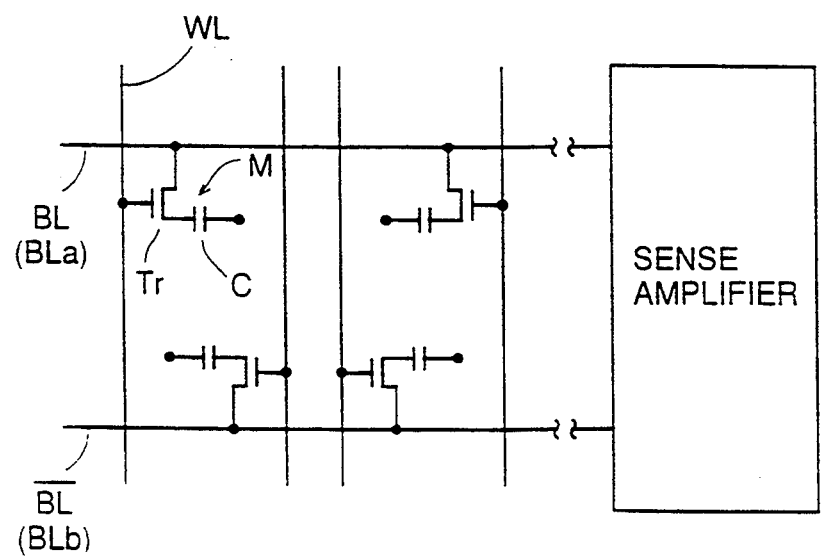
FIG. 34 is an equivalent circuit diagram of memory cells in the prior art DRAM.
Figure 35:
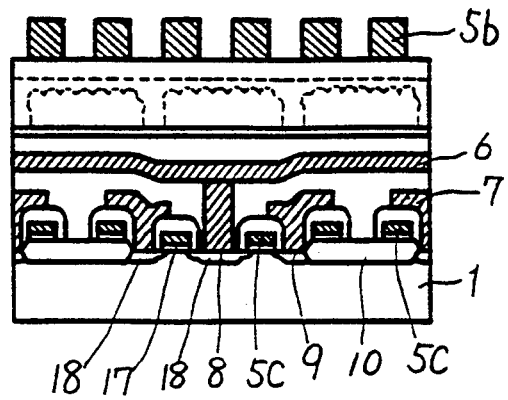
FIG. 35 is a cross-sectional view of a memory cell structure in the prior art DRAM.

Referring to FIG. 30, a first polycrystal silicon layer containing n-type impurities is formed. The first polycrystal silicon layer is topped with a first silicon oxide film. Etching by photolithography produces the first polycrystal silicon layer 6 and the first silicon oxide film 11 in accordance with a predetermined bit line pattern layout. Then, the whole surface is covered with a second silicon oxide film 12a, as illustrated in FIG. 30. Performing anisotropic etching on the second silicon oxide film 12a produces side wall layers of the second silicon oxide film 12 for the bit lines 6 made of the first polycrystal silicon layer and for the first silicon oxide film 11. A plan view of this structure is shown in FIG. 27, and a cross-sectional view thereof, in FIG. 31.

A second polycrystal silicon layer containing n-type impurities is then formed. Etching by photolithography produces the second polycrystal silicon layer 7 in accordance with a predetermined storage node pattern layout. A plan view of this layout is shown in FIG. 22.

Subsequent thermal treatment causes the n-type impurities of the first and second polycrystal silicon layers 6 and 7 to diffuse into the silicon substrate. This produces source-drain regions A and C of the junction field effect transistor, as illustrated in FIG. 23. A dielectric film 13 made of a thin silicon oxide film is then formed over the surface of storage nodes 7. The dielectric film 13 is topped with cell plate electrodes 14 made of a third polycrystal silicon layer containing impurities. The cell plate electrodes 14 are in turn covered with a third silicon oxide film 15. The third silicon oxide film 15 is topped with an aluminum film. Subjecting this arrangement to etching by photolithography produces the second word lines 5b. Lastly, a surface protective film 16 is made from a silicon oxide film. In this manner, the memory cells are produced according to the invention; the structure of the memory cells is depicted in FIGS. 23 and 24.

The memory cell structure of the DRAM and the method for manufacturing it according to the invention are based on junction field effect transistors composed of the n-type impurity diffusion layer 2, i.e., the n-channel type junction field effect transistors. Alternatively, memory cells may be constituted by p-channel type junction field effect transistors.

As described, one advantage of the junction field effect transistor according to the invention is the elimination of the problem of transistor characteristic deterioration caused by the hot carrier phenomenon that accompanies channel length reduction. Thus, constructing memory cells by use of the invented junction field effect transistors permits higher degrees of memory cell integration than ever before. Because the invented junction field effect transistor is formed with its gate region contained within the semiconductor substrate, semiconductor memory cell integration is further enhanced.

Another advantage of the junction field effect transistor according to the invention is that the gate region potential is controlled independently of the substrate potential.

A major benefit of the semiconductor memory device manufactured according to the invention is summarized as follows: the word lines are formed within the semiconductor substrate, and are topped with the bit lines. This arrangement makes it possible to furnish bit line contacts on top of the word lines. Since there is no need to provide bit line contacts between the word lines as is the case with the prior art, the spacing between the word lines is shortened appreciably. This makes it easier to enhance the degree of circuit integration of semiconductor memory devices.

It is to be understood that while the invention has been described in conjunction with specific embodiments, it is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. A semiconductor memory device including a junction field effect transistor and a capacitor, comprising:
    a semiconductor substrate having a main surface;
    an impurity region of a first conductivity type formed in the main surface of said semiconductor substrate; and
    an impurity region of a second conductivity type formed on the main surface of said semiconductor substrate so as to contact said impurity region of the first conductivity type;
    said junction field effect transistor including said impurity region of the first conductivity type and said impurity region of the second conductivity type;
    said impurity region of the first conductivity type constituting a gate region;
    said impurity region of the second conductivity type including a channel region, a first region and a second region, said channel region being interposed between said first and second regions with a predetermined distance;
    wherein a junction depth of said channel region relative to said impurity region of the first conductivity type is less than a junction depth of each of said first and second regions relative to the impurity region of the first conductivity type; and
    said capacitor comprises a first electrode in contact with said first region, a dielectric film formed on said first electrode, and a second electrode formed on said dielectric film, wherein said first electrode is formed above said channel region and above an insulating sidewall spacer, a bottom of said sidewall spacer which is in contact with the channel region having a horizontal thickness, and the length of the channel region is equal to said horizontal thickness of said insulating sidewall spacer.

2. A dynamic semiconductor memory device including junction field effect transistors and capacitors, comprising:

a semiconductor substrate having a main surface;

a plurality of word lines formed electrically isolated from one another on the main surface of said semiconductor substrate and composed of an impurity region of a first conductivity type extending in a first direction;

a plurality of bit lines formed on said plurality of word lines and extending in a second direction intersecting said first direction; and a plurality of memory cells disposed at points of intersection between said plurality of word lines and said plurality of bit lines;

said memory cells each comprising one of said junction field effect transistors and one of said capacitors;

said junction field effect transistors each containing a gate region and an impurity region of a second conductivity type, said gate region being formed of an impurity region of a first conductivity type connected to said word line, said impurity region of said second conductivity type being formed on the main surface of said semiconductor substrate so as to contact said gate region;

said impurity region of the second conductivity type including a channel region, a first region and a second region, said channel region being interposed between said first and second regions with a predetermined distance;

said plurality of bit lines being each formed so as to contact said second region;

wherein a junction depth of said channel region relative to said gate region is less than a junction depth of each of said first and second regions relative to said gate region; and each of said capacitors comprises a first electrode in contact with said first region, a dielectric film formed on said first electrode, and a second electrode formed on said dielectric film, wherein said first electrode is formed above said channel region and above an insulating sidewall spacer, a bottom of said sidewall spacer which is in contact with the channel region having a horizontal thickness, and the length of the channel region is equal to said horizontal thickness of said insulating sidewall spacer.

3. The dynamic semiconductor memory device according to claim 2, wherein said plurality of word lines are formed on said semiconductor substrate so as to be electrically isolated from one another, the electrical isolation being achieved by use of an isolation oxide film of a first thickness.

4. The dynamic semiconductor memory device according to claim 3, wherein said isolation oxide film includes portions being in contact with said impurity region of the second conductivity type and having a second thickness less than said first thickness.

5. The dynamic semiconductor memory device according to claim 4 wherein the thickness of said isolation oxide film on said semiconductor substrate having the second thickness is less than a depth of said impurity region of the first conductivity type.

6. The dynamic semiconductor memory device according to claim 3 wherein said first electrode is formed so as to extend over said isolation oxide film.

7. The dynamic semiconductor memory device according to claim 2, wherein said first electrode is formed so as to extend over said plurality of bit lines with an insulation film interposed between said first electrode and said bit lines.

8. The dynamic semiconductor memory device according to claim 2, further comprising second word lines extending in the same direction as said plurality of word lines and formed on said second electrode with an insulation film interposed between each of said second word lines and said second electrode.

* * * * *